United States Patent [19]
Chang

[11] Patent Number: 5,856,794
[45] Date of Patent: Jan. 5, 1999

[54] METHOD AND APPARATUS FOR SCANNING KEYBOARD AND DIODE OPTION

[75] Inventor: Herman Chang, Hsinchu, Taiwan

[73] Assignee: Utek Semiconductor Corporation, Hsinchu, Taiwan

[21] Appl. No.: 870,175

[22] Filed: Jun. 6, 1997

[30] Foreign Application Priority Data

Dec. 19, 1996 [TW] Taiwan ................................. 85115664

[51] Int. Cl.⁶ ................................................. H03K 17/94
[52] U.S. Cl. ...................... 341/26; 341/22; 340/825.79; 345/168; 379/368; 364/705.05
[58] Field of Search .................. 341/22, 26; 340/825.79; 379/368; 345/168; 364/705.05, 709.12

[56] References Cited

U.S. PATENT DOCUMENTS

| | | | |
|---|---|---|---|
| 4,194,425 | 3/1980 | Kitagawa | 341/24 |
| 4,234,872 | 11/1980 | Halder | 341/26 |
| 4,408,184 | 10/1983 | Ishii | 341/26 |
| 4,441,097 | 4/1984 | Anderson | 341/26 |
| 4,599,608 | 7/1986 | Matsuoka | 341/26 |
| 4,918,445 | 4/1990 | Bower | 341/26 |
| 5,070,330 | 12/1991 | Wu | 341/26 |
| 5,254,989 | 10/1993 | Verrier et al. | 341/22 |
| 5,677,687 | 10/1997 | Valdenaire | 341/26 |

*Primary Examiner*—Michael Horabik
*Assistant Examiner*—Timothy Edwards, Jr.
*Attorney, Agent, or Firm*—W. Wayne Liauh

[57] ABSTRACT

A method and apparatus for improved scanning keyboard and diodes option is disclosed. Each of the pins is treated as one independent dimension so as to define a multi-dimensional configuration. The circuit includes a clock generation circuit, a keyboard I/O port device comprising a plurality of ports associated with the pins and a key detection register device. A key is arranged at the interconnection of any two ports. When the key is depressed, by maintaining the ports at a first level and applying a second level to each of the ports to check which port goes from the first level to the second level, the location of the key may be determined. The output of the ports are stored in the key detection register device for the determination of the key location.

5 Claims, 7 Drawing Sheets

METHOD AND APPARATUS FOR SCANNING KEYBOARD AND DIODE OPTION

BACKGROUND OF THE INVENTION

1. Field of the Invention

The present invention relates to a keyboard scanning circuit, and, more particularly, to an improvement over the conventional two-dimensional telephone keyboard scanning circuit which provides the maximum number of keys available in a telephone system with a given number of pins and to integrate other functions thereon to be selected by means of diodes.

2. Brief Description of the Prior Art

Figure 1:
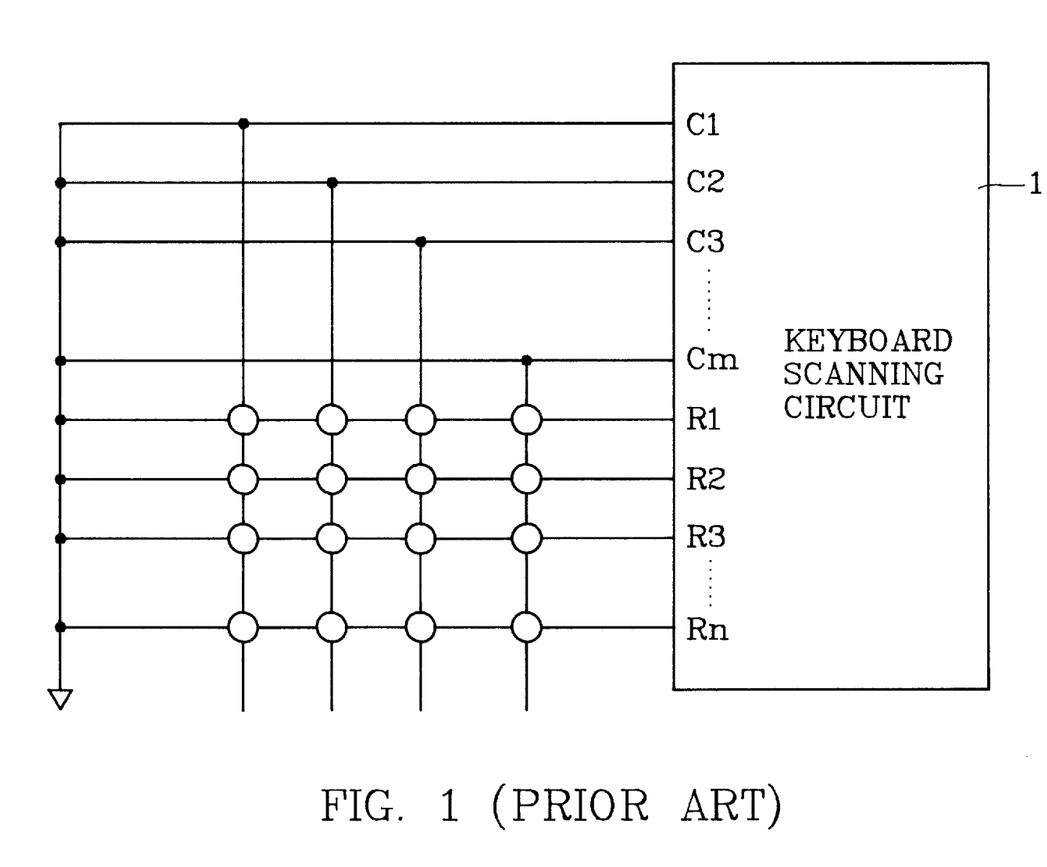
FIG. 1 is a schematic circuit diagram showing a prior art two-dimensional keyboard.

A conventional two-dimensional keyboard scanning circuit of a telephone system has a configuration that data ports thereof are divided into two dimensional ports, i.e. the row ports and the column ports, to correspond to a two-dimensional matrix. In the two-dimensional keyboard configuration, a key switch is available in the interconnection between any one of the row ports and any one of the column ports, as shown in FIG. 1. Such a conventional keyboard configuration has a limitation in the maximum number of keys that are available for no key is arranged on the interconnection between any two ports of the same set, for example between two columns or between two rows.

As shown in FIG. 1, the keyboard scanning circuit of the conventional two-dimensional keyboard configuration, which is designated with reference numeral 1, comprises m columns (C1, C2, . . . , Cm) and n rows (R1, R2, . . . , Rn). In accordance with the conventional two-dimensional keyboard arrangement, a key switch may be provided between each of the rows and each of the columns, namely in mathematical form between the ith column ($1 \leq i \leq m$) and the jth row ($1 \leq j \leq n$). Hence, the maximum number of keys available in the two-dimensional keyboard configuration is m×n and no key is available between any two rows or between any two columns. However, since actually, the rows and columns have no difference from each other, it is a waste for not being able to provide a key between any two rows or any two columns.

Furthermore, in the conventional two-dimensional keyboard configuration, a 3.58 MHz oscillator is usually adopted to provide the system frequency of the keyboard scanning operation. In detecting the actuation of a key, all the columns are set to for example a logic high level and the rows are set to logic low level so that a detection of the change of output from high to low occurring at one of the columns indicates the associated key is depressed or actuated. Using a 3.58 MHz oscillator to provide the system frequency consumes dissipates much more power than using a 32768 Hz oscillator and it is about 100 times more power dissipation. This is also a serious problem to be overcome.

SUMMARY OF THE INVENTION

For obviating the aforementioned problem and drawback found in the conventional keyboard scanning circuit, it is the primary object of the present invention to provide an improved keyboard scanning circuit. The present invention provides a multi-dimensional keyboard configuration by modifying the conventional two-dimensional keyboard to have each of the rows and columns stand for an independent dimension allowing a key to be arranged at the interconnection between any two of the ports of the keyboard and thus overcoming the drawbacks on the limitation of the number of keys found in the conventional two-dimensional keyboard configuration.

The other object of the present invention is to provide a keyboard scanning circuit which provides the maximum number of keys available in a keyboard having a given number of pins or ports.

It is another object of the present invention to provide a keyboard scanning circuit which allows the pins of a telephone keyboard to be reduced but provides the same number of keys, comparing with the conventional two-dimension keyboard.

It is a further object of the present invention to provide a telephone keyboard scanning circuit into which diodes are incorporated for the selection of a number of additional functions integrated in the circuit.

It is yet a further object of the present invention to provide a keyboard scanning circuit and the operation method thereof which uses a low frequency oscillator in constructing the circuit so as to reduce the manufacturing cost, simplify the circuit design and decrease the power dissipation thereof.

It is a further object of the present invention to provide a keyboard scanning circuit and the operation method thereof in which the oscillator is start up once the power is on and the oscillator continuously oscillate to generate a timing clock signal and also to provide two independent paths of scanning the diodes and scanning the keys so as to avoid mis-judgment.

It is a further object of the present invention to provide a keyboard scanning circuit and the operation method thereof in which the oscillator does not triggered at the time when the power is on or when the telephone is hanged up and the oscillator is only triggered when the handset is picked up and then continuously generates a timing clock and also to provide two independent paths of scanning the diodes and scanning the keyboard so as to avoid mis-judgment.

The keyboard scanning method in accordance with the present invention treats each of the pins or ports of the keyboard as an independent dimension and the circuit thereof comprises a timing clock signal generation circuit, keyboard I/O port means having a plurality of ports, key detection registers and diode detection registers.

In accordance with the present invention, there are two methods to implement the present invention which respectively comprise the following steps:

METHOD 1

(1) Powering on the telephone system in which the keyboard is incorporated;
(2) The oscillator starting up and generating the timing clock signal with the timing clock generation circuit to scan each port of the I/O port means;
(3) Pick-up the handset and thus making the telephone on line;
(4) Scanning the diodes to obtain a diode scanning result which is then stored in the diode detection registers; and
(5) Scanning keys of the keyboard to obtain a key scanning result which is then stored in the key detection registers.

METHOD 2

(1) Powering on the telephone system or hanging up the telephone in which the keyboard is incorporated;
(2) Pick-up the handset and thus making the telephone on line;
(3) The oscillator starting up and generating the timing clock signal with the timing clock generation circuit to scan each port of the I/O port means;

(4) Scanning the diodes to obtain a diode scanning result which is then stored in the diode detection registers; and (5) Scanning keys of the keyboard to obtain a key scanning result which is then stored in the key detection registers.

The keyboard scanning circuit and the operation method thereof in accordance with the present invention treats each of a plurality of pins or ports of the keyboard as an independent dimension, the keyboard comprised of a plurality of keys arranged at interconnections between any two of the ports, and the circuit comprising:

a timing clock generation circuit;

a keyboard I/O port means comprising the plurality of ports to which the timing clock signal generated by the timing clock generation circuit is applied; key detection registers for receiving the timing clock signal from the timing clock generation circuit and receiving and storing keyboard I/O state from the keyboard I/O port means; and optionally further comprising a plurality of diodes connected between the ports and diode detection registers for receiving the timing clock signal from the timing clock generation circuit and receiving and storing the status of the diodes.

DETAILED DESCRIPTION OF PREFERRED EMBODIMENT

Figure 2:
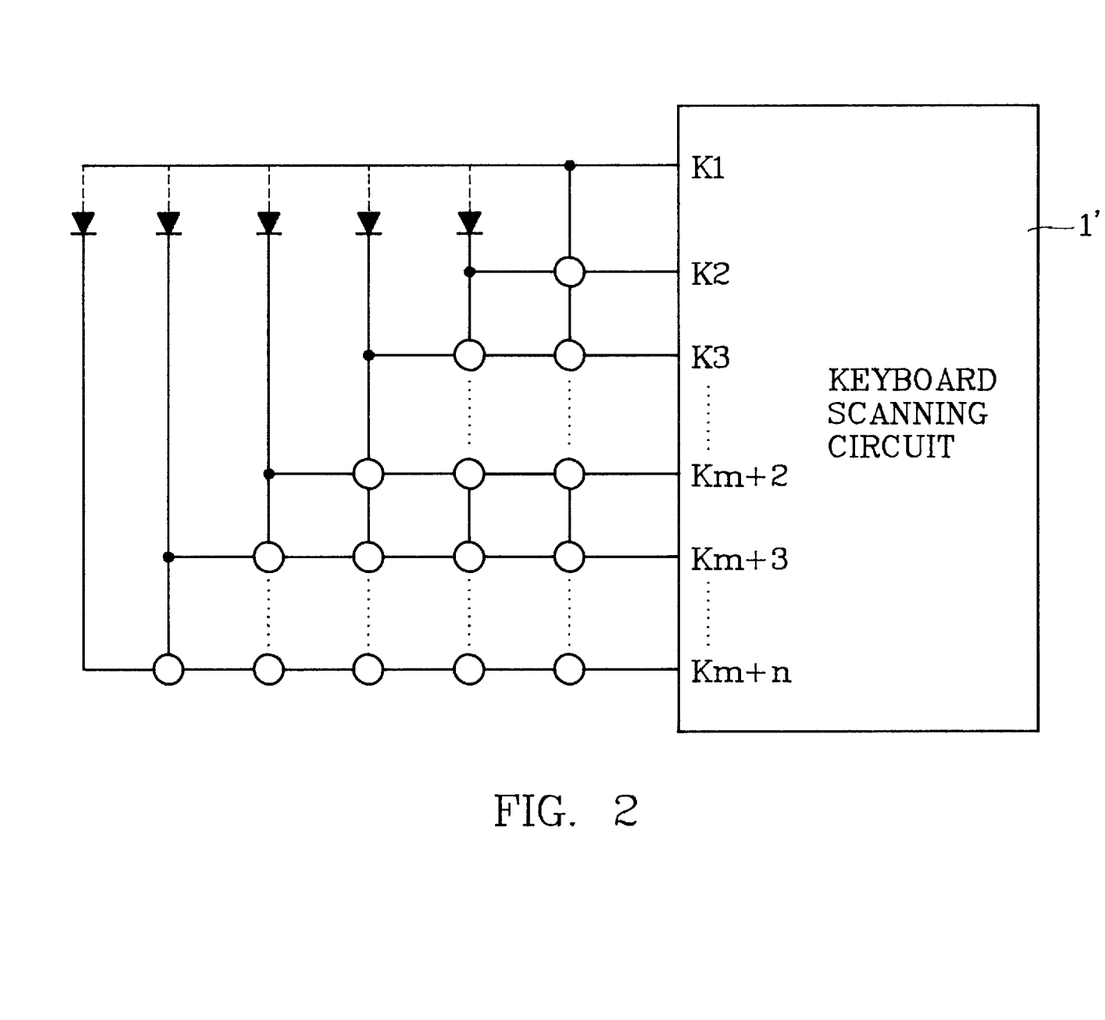
FIG. 2 is a schematic circuit diagram showing a multi-dimensional keyboard configuration with diode-based key selection interface in accordance with the present invention.

FIG. 2 is a schematic circuit diagram showing a multi-dimensional keyboard configuration in accordance with the present invention. A number of diodes and key switches in combination form a diode and key matrix for the keyboard configuration of the present invention. A keyboard scanning circuit 1 is provided with a plurality of I/O ports arranged to scan the diodes and the key switches of the diode and key matrix. As shown, the keyboard scanning controller 1' is obtained by modifying the conventional two-dimensional configuration into a multi-dimensional configuration wherein each of the I/O ports thereof is regarded as an independent dimension. Namely, the m columns and n rows of the conventional two-dimensional configuration is treated as m+n independent ports K1, K2, . . . , Km+2, Km+3, . . . , Km+n according to the present invention.

According to the arrangement of the present invention, there may be a key switch or keypad between any two of the ports and there are in total C(m+n,2) keys, namely (m+n)×(m+n−1)/2. For example, if there are eight (8) ports, then the number of keys that is available in the conventional two-dimensional keyboard configuration and the multi-dimensional keyboard configuration in accordance with the present invention are shown as follows:

(1) The number of keys of the conventional two-dimensional configuration is equal to 4×4=16

(2) The number of keys of the multi-dimensional configuration of the present invention is equal to (8×7)/2= 28 Quite obviously, the total number of keys of the present invention is much more than that of the conventional two-dimensional keyboard configuration. In addition, the present invention incorporates a plurality of diodes in the key matrix circuit to serve as selection elements of additional functions which will be described hereinafter.

Figure 3:
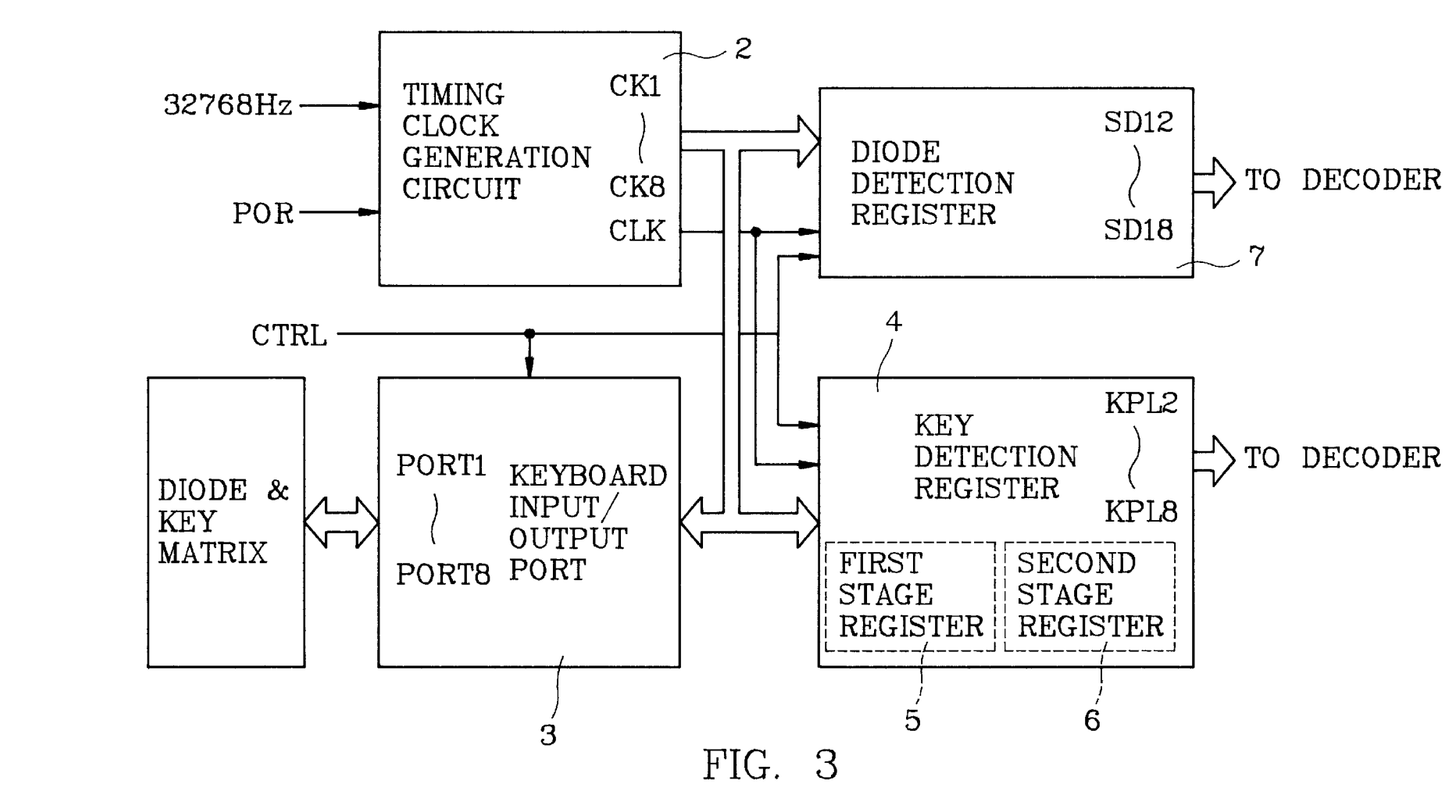
FIG. 3 is the block diagram of the circuit in accordance with the present invention.

FIG. 3 shows a functional block diagram in accordance with a preferred embodiment of the present invention, which mainly includes a timing clock generation circuit 2, a keyboard input/output means 3, a key detection register 4, and a diode detection register 7.

It is, noted that the timing clock generation circuit 2 uses a 32768 Hz low frequency oscillator generates desired timing clock signal on the basis of the 32768 Hz system frequency.

The timing clock including CK1 to CK8 and CLK generated by the clock generation circuit 2 is applied to both diode detection register 7 and key detection register 4 which also receive a control signal CTRL.

The keyboard I/O port means 3 includes a plurality of data I/O ports PORT1-PORT8 connected to the keys (such as K12, K13, . . . , K78 in FIG. 5) and the diodes (such as D12, D13, . . . , D18 in FIG. 5) which are together referred to as diode and key matrix. The keyboard I/O port means 3 also receives the timing clock signal from the timing clock generation circuit 2. The key detection register which is designated at 4 comprises a first stage register 5 and a second stage register 6. The first stage register 5 receives and temporarily stores input signal representing the status of the keys which is shifted to the second stages register 6 upon triggered by a suitable triggering signal. The second stage register 6 provides the output of the key status at its output ports KPL2–KPL8.

The diode detection register which is designated at 7 serves to store the status of the diodes and provides output thereof at its output ports SD12–SD18. The outputs KPL2–KPL8 and SD12–SD18 of both key detection register 4 and 7 may be further processed by being applied to for example a central processing unit or a decoding unit (not shown in the drawings). The numbers of the output pins of both the key detection register 4 and the diode detection register 7 are variable dependent upon the actual number of ports of the keyboard configuration.

Figure 4:
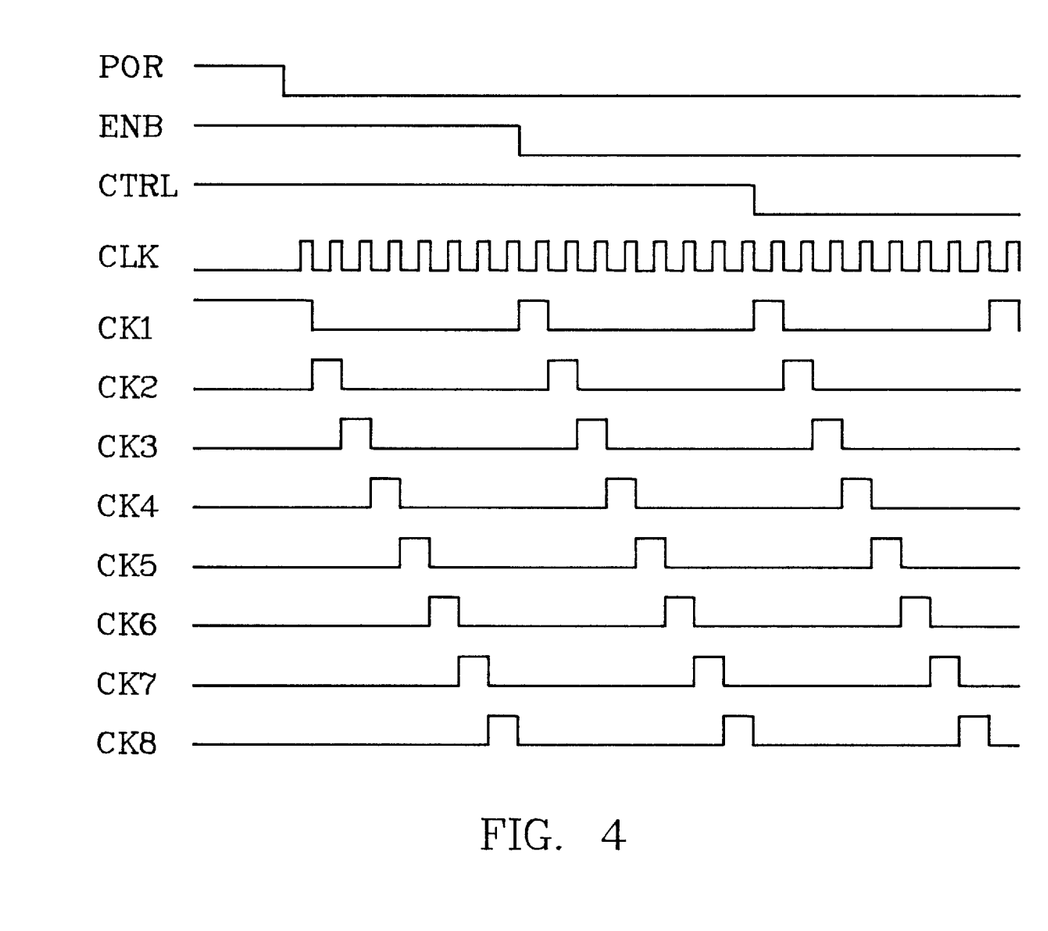
FIG. 4 shows the timing clock adapted in the circuit of the present invention shown in FIG. 3.
Figure 5:
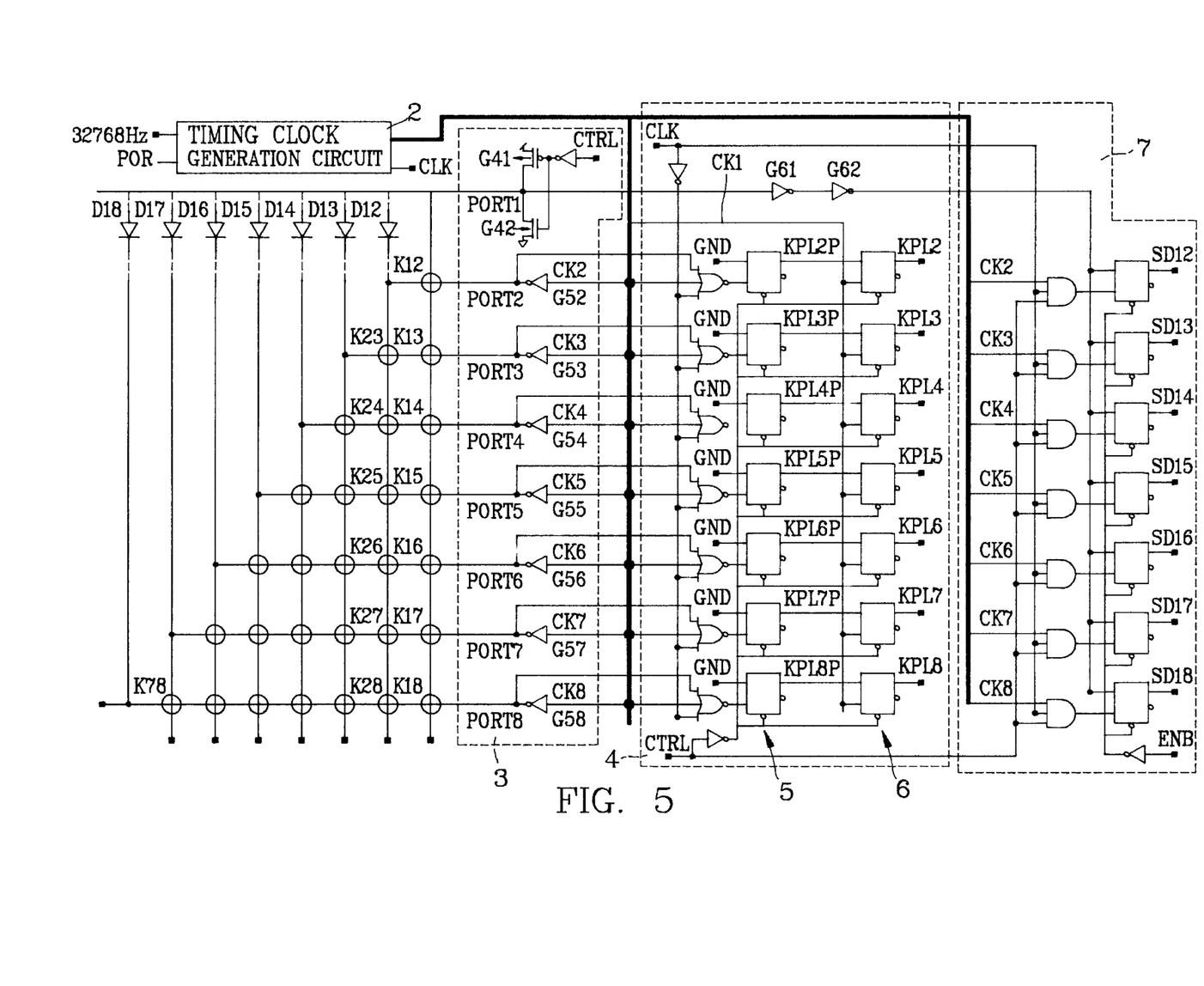
FIG. 5 is a circuit diagram of keyboard scanning circuit in accordance with the present invention.

FIG. 4 shows a timing diagram of the associated timing clock signals and control signals in the circuit in accordance with a preferred embodiment of the present invention. FIG. 4 will be described with additional reference to a circuit diagram of a preferred circuit arrangement shown in FIG. 5. Before a description of the operation of the circuit in accordance with the preferred embodiment of FIG. 5 is given, the operation in accordance with two preferred methods of the present invention, shown in FIGS. 6 and 7, will be described first.

Figure 6:
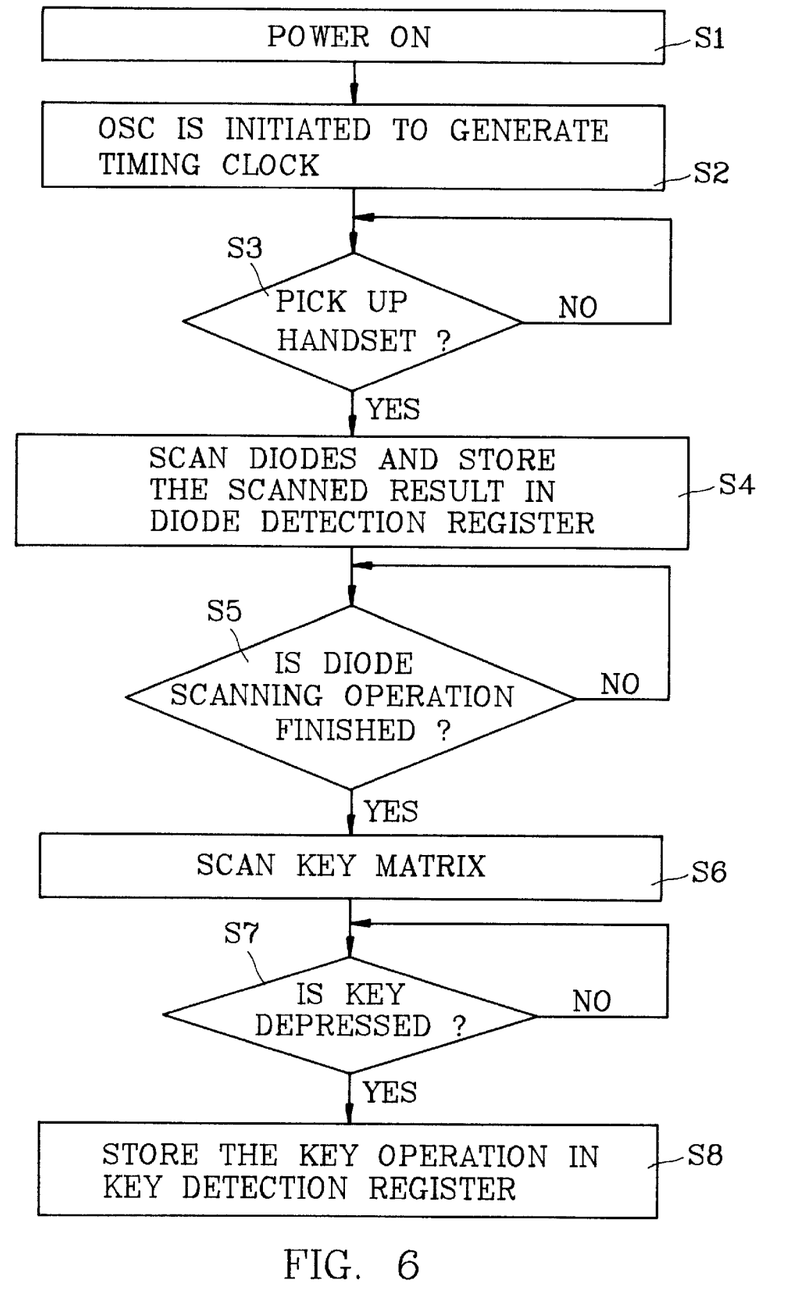
FIGS. 6 and 7 are flow charts of two operation methods in accordance with the present invention.

The operation of the circuit in accordance with the present invention will be described with reference to a flow chart shown in FIG. 6. Once a telephone system in which the keyboard is incorporated is powered on, step S1, the oscillator starts to oscillate at step S2, and timing clock signal is generated by the timing clock generation circuit 2 on the basis of the frequency provided by the oscillator (32768 Hz in this case) to scan each of the ports of the keyboard I/O port means 3. If, at step S3, the handset is picked up, then the telephone system gets into diode scanning phase first, step S4, and the result of diode scanning operation which indicates the status of the diodes is stored in the diode detection register 7. After the diode scanning operation is done, a key scanning operation is carried out at step S6, and the period within which the key scanning operation is performed is referred to as key scanning phase. If a key is found to be depressed, step S7, then the result of the key scanning operation is sent to and stored in key detection register 4 in step S8.

Figure 7:
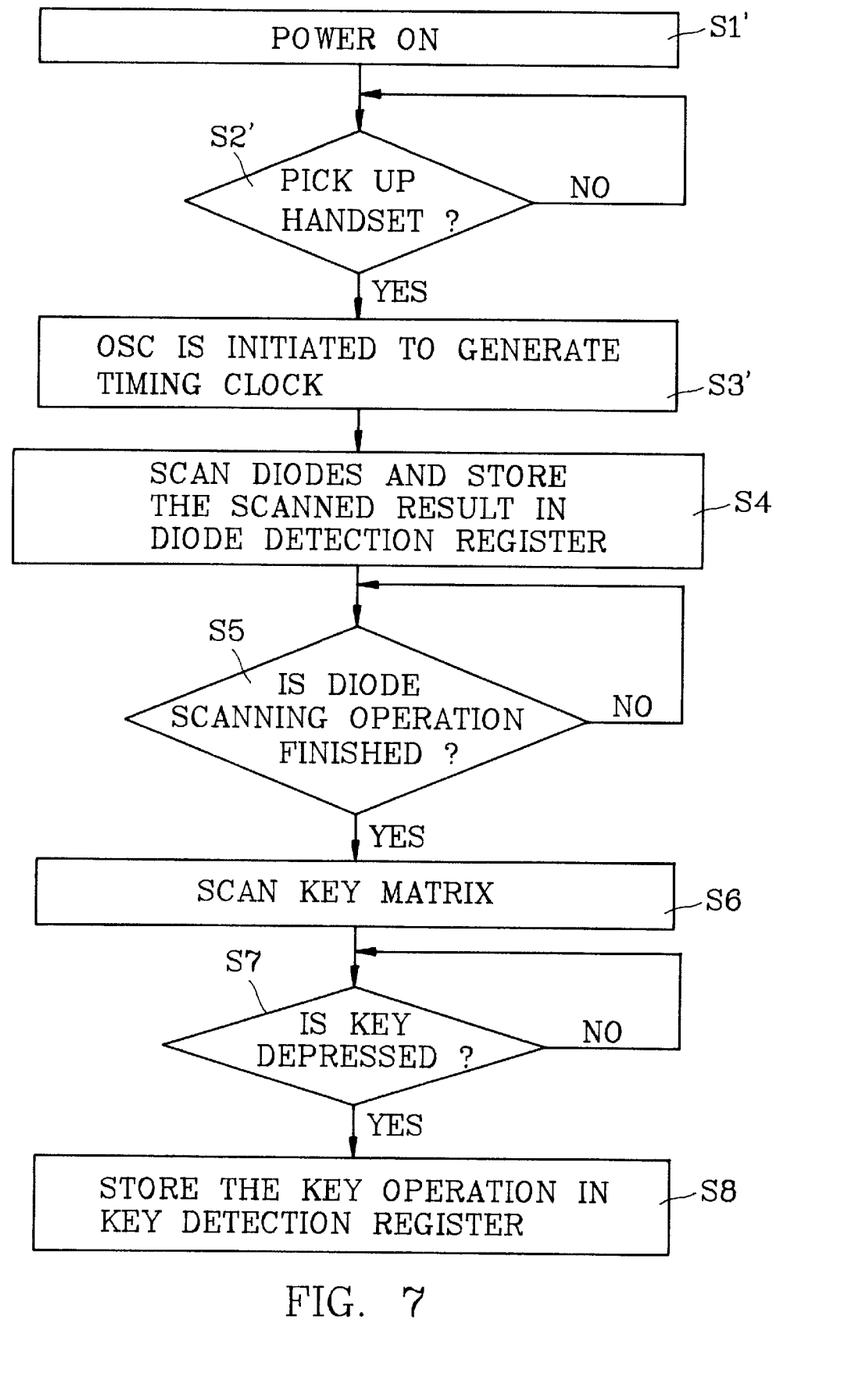

The operation of the circuit in accordance with the present invention may be carried out in another way, as the flow chart shown in FIG. 7. The difference between the two methods shown in FIGS. 6 and 7 is that the oscillator is not started up immediately after the telephone system is powered on. Thus the second method comprises the following steps in sequence: powering on the telephone system into which the keyboard is incorporated (step S1), picking up a handset of the telephone (step S2), starting up the oscillator (step S3), scanning the diodes and storing the scanning result (the status of the diodes) in diode detection register 7 (step S4) and completing the diode scanning operation (step S5), scanning the keys of the keyboard (step S6) and if a key is found depressed (step S6), then store the scanning result indicating the status of the keys in the key detection register 4 (step S8). Besides the sequence of steps S2 and S3, the operation of FIG. 7 is substantially identical to that of FIG. 6 and further description will not be needed.

The circuit shown in FIG. 5 will be now described with reference to the operation process shown in FIG. 6. When the system is powered on and the oscillator is started up to allow the timing clock generation circuit 2 to generate the timing clock signal, a POR signal of the timing clock generation circuit 2 changes from a high level to a low level. The system frequency (32768 Hz in this case) is divided to provide clock signals CLK and CK1–CK8 as shown in FIG. 4.

Once the handset is picked up, the system becomes active and an enable signal ENB goes from a high level to a low level. If the control signal CTRL is also in high level, then the diode scanning operation is initiated. At this time, the key detection register 4 is continuously reset due to the high level of the signal CTRL. As described previously, the key detection register 4 comprises a first stage register 5 and a second stage register 6. The result of the diode scanning operation is stored in the diode detection register 7. A high level output of SD1m (where m is an integer from 2 to 8) of the diode detection register 7 indicates no diode is provided at the port associated with the output SD1m and a low level output of SD1m indicates a diode is provided at the corresponding location.

The diode scanning operation will be described now. In the diode scanning phase, the control signal CTRL is high and thus transistor G41 is conducted but transistor G42 is not conducted and output of PORT1 is in high level. When the signal CK1 is high, the outputs of the ports PORT1–PORT8 are all in high and signal CK1 provides no function at this phase.

The output of inverter G52 is low when signal CK2 is high, and that is the output of PORT2 is low, while the outputs of the remaining ports PORT1 and PORT3–PORT8 are all high. If there is a diode D12 connected from PORT1 to PORT2, then a direct current path is formed from PORT1 through the diode D12 to PORT2. The voltage of PORT1 is thus decreased to approximate 0.7V and is applied to inverter G61 to be recognized as low level which is then sent through inverter G62 to the input of the diode detection register 7 of which the initial value is set to high level and the output signal SD12–SD18 is initially indicated as "1111111". When CLK changes from low to high, the signal from PORT1 to the diode detection register 7 is stored to have SD12=0 which indicates that a diode is detected. In this case, the output of SD12–SD18 is shown as "0111111". If no diode connects PORT1 to PORT2, PORT1 is kept in high and when CLK changes from low to high, SD12 is maintained at high level which means no diodes is detected and thus SD12–SD18 are "1111111".

When signal CK3 is high, the output of inverter G53 is low, and is the output of PORT3 is low, while the outputs of the remaining ports PORT1, PORT2, and PORT4–PORT8 are all high. If a diode D13 is connected from PORT1 to PORT3, a direct current path is formed from PORT1, through the diode D13, to PORT3. The output of PORT1 is decreased to approximately by 0.7V which is sent to the inverter G61 to be recognized as low level. The inverter G62 sends the low level signal to the input of the diode detection register 7. When the signal CLK changes from low to high, the signal from PORT1 is detected and stored in the diode detection register 7 to have SD13=0 which indicates a diode is detected. In this case, the output SD12–SD18 is shown as "1011111". If there is no diode D13 connected from PORT1 to PORT3, then PORT1 is maintained at high level so that when CLK changes from low to high, SD13=1 is detected and stored in the diode detection register 7 which means no diode D13 is detected and SD12–SD18 are "1111111".

Similarly, when the signals CK4–CK8 are scanned in sequence, the diode at corresponding position may be detected with the same way. Thus by checking the outputs SD12–SD18, it can be easily determined if there are diodes attached at keyboard input/output port.

After each of the signals. CK1–CK8 is scanned, the signal CTRL changes from high to low to indicate the diode scanning phase is ended and the key scanning phase is started. In this phase, the signal CTRL is in low level and the transistor G41 is not conducted while the transistor G42 is conducted. This indicates that the output of PORT1 is low.

In the key scanning phase, the signal stored in the diode detection register 7 is preserved and the result of key scanning operation is stored in the key detection register 4. The timing clock generation circuit 2 continues generating the signals CK1–CK8 to scan the I/O port means 3 to check the status of the keys.

The key scanning phase will be described in detail now. The data stored in the first stage register 5 are shifted to the second stage register 6 when signal CK1 changes from low to high.

When the signal CK2 changes from low to high, PORT2 is low and the remaining ports PORT3–PORT8 are all in high level. The major task at this time is to check if a key connecting from any one of PORT1 and PORT3–PORT8 to PORT2 is depressed. If a key is depressed, then signals PORT3–PORT8 are forced from high to low and are applied to the input of the first stage register 5 of the key detection register 4. When the signal CLK changes from low to high, the status of PORT3–PORT8 are locked in the first stage register 5.

When the signal CK3 changes from low to high, PORT3 is low and the remaining ports PORT2 and PORT4–PORT8 are all high. The major task at this time is to check if a key connecting from any one of PORT1, PORT2 and PORT4–PORT8 to PORT3 is depressed. If a key is depressed, then signals PORT2 and PORT4–PORT8 are forced from high to low and are applied to the input of the first stage register 5 of the key detection register 4. When the signal CLK changes from low to high, the status of PORT2 and PORT4–PORT8 are locked in the first stage register 5.

After a whole cycle of scanning operation through CK1–CK8, the status of the keys is stored in the first stage register 5. At next time when CK1 changes from low to high, the scanned result which is stored in the first stage register 5 is shifted to the second stage register 6. Thus by inspecting the outputs KPL2–KPL8 of the second stage register 6, the actuation or depression of any of the keys can be identified.

Taking key K13 as an example. When the signal CK1 changes from low to high, the data in the first stage register 5 are shifted to the second stage register 6. Assuming initially, both the first stage register 5 and the second stage register 6 are set to high, at this time, outputs KPL2P–KPL8P of the first stage register 5 are shown as "1111111", wherein "1" indicates high level. The outputs KPL2–KPL8 of the second stage register 6 are also shown as "1111111".

When the signal CK2 changes from low to high, the output of PORT2 is low level and the ports PORT3–PORT8 are all high level. When key K13 is depressed, the signal PORT3 is forced by PORT1 to go from high to low. When the signal CLK changes from low to high, the status of PORT3–PORT8 is locked in the first stage register 5. At this time, the outputs KPL2P–KPL8P of the first stage register 5 are shown as "1011111", wherein the signal KPL2P is in high level because in the high level period of CK2, the signal from PORT2 is not stored.

When signal CK3 changes from low to high, the output of PORT3 is low level and PORT2 and PORT4–PORT8 are high level. When the signal CLK changes from low to high, the status of PORT2 and PORT4–PORT8 are locked in the first stage register 5 and at this time, the outputs KPL2P–KPL8P of the first stage register 5 are shown as "1011111".

When signal CK4 changes from low to high, the output of PORT4 is low level and PORT2, PORT3 and PORT5–PORT8 are high level. Since key K13 is depressed, the signal of PORT3 is forced by PORT1 to go from high to low. When the signal CLK changes from low to high, the status of PORT2, PORT3 and PORT5–PORT8 are locked in the first stage register 5 and at this time, the outputs KPL2P–KPL8P of the first stage register 5 are shown as "1011111".

After a whole cycle of scanning operation through CK1–CK8, the outputs KPL2P–KPL8P show the data stored in the first stage register 5 is "1011111". At the next time when CK1 changes from low to high, the previous scanning result which is stored in the first stage register 5 is shifted to the second stage register 6. Thus, by reading the contents of the second stage register 6, which as shown in KPL2–KPL8 is "1011111 " in this case, one can readily know that the key that is depressed is the one connected between PORT1 and PORT3 and that is the key K13. Now taking key K24 as another example to describe the present invention. When the signal CK1 changes from low to high, what is stored in the first stage register 5 will be shifted to the second stage register 6. At this time, the outputs KPL2P–KPL8P of the first stage register 5 are shown as "1111111" where "1" indicates high level. The outputs KPL2–KPL8 of the second stage register are also "1111111".

When the signal CK2 changes from low to high, the output of PORT2 is low level and PORT3–PORT8 are high level. Since key K24 is depressed, the signal PORT4 is forced by PORT2 to go from high to low. When the signal CLK changes from low to high, the status of PORT3–PORT8 is locked in the first stage register 5. At this time, the outputs KPL2P–KPL8P of the first stage register 5 are shown as "1101111", wherein signal KPL2P is high because in the interval when the signal CK2 is high it does not store the signal from PORT2.

When the signal CK3 changes from low to high, the output of PORT3 is low and PORT2 and PORT4–PORT8 are high. When the signal CLK changes from low to high, the status of PORT2, PORT4–PORT8 is locked in the first stage register 5. At this time, the outputs KPL2P–KPL8P of the first stage register 5 are shown as "1101111".

When the signal CK4 changes from low to high, the output of PORT4 is low level and PORT2, PORT3 and PORT5–PORT8 are high level. Since key K24 is depressed, PORT2 is forced by PORT4 to go from high to low. When the signal CLK changes from low to high, the status of PORT2, PORT3 and PORT5–PORT8 is locked in the first stage register 5. At this time, the outputs KPL2P–KPL8P of the first stage register 5 are shown as "0101111".

After a whole cycle of scanning operation through CK1–CK8, the outputs KPL2P–KPL8P show data stored in the first stage register 5 as "0101111". At the next time when CK1 changes from low to high, the previous scanning result which is stored in the first stage register 5 is shifted to the second stage register 6. Thus, by reading the contents of the second stage register 6, which as shown in KPL2–KPL8 is "0101111" in this case, one can readily know that the key that is depressed is the one connected between PORT2 and PORT4 and that is the key K24.

In the embodiment illustrated, the diodes are connected between the ports of the keyboard I/O port means 3. However, it is also possible to connect the diodes between the keyboard I/O port means and one of the pins of the integrated circuit. All such modifications are deemed within the scope of the present invention.

The method and apparatus of present inventive keyboard scanning and interface circuit selection with diode are provided by modifying the conventional two-dimensional configuration and thus eliminating the limitation imposed on the two-dimensional configuration by treating each of the pins or ports as an independent dimension, defining a multi-dimensional configuration, so that a maximum number of keys may be obtained with the same number of pins or to obtain the same number of keys with a reduced number of pins. Further, the present invention provides diodes on the circuit, serving as additional function selection keys, so as to integrate a number of additional functions in the system. Moreover, by using a low frequency oscillator to drive the system, the manufacturing cost is reduced, the circuit is, simplified and the power dissipation is also reduced. Besides, in accordance with the present invention, the oscillator uninterruptedly oscillates to generate timing clock signal and provides two independent paths of diode scanning and key scanning so as to avoid mis-judgment.

It is apparent that although the invention has been described in connection with a preferred embodiment, those skilled in the art may make changes to certain features of the preferred embodiment without departing from the spirit and scope of the invention as defined in the appended claims.

What is claimed is:

1. A method for scanning a keyboard system having a plurality of scanning lines and key switches arranged at interconnection between any two of the scanning lines, the method comprising steps of:

a. powering on the keyboard system;

b. generating a timing clock and applying the timing clock to scan the scanning lines, wherein the scanning operation comprises the steps of:

b1. maintaining the scanning lines at a first level so as to have output of each of the scanning lines to be at the first level, b2. actuating one of the keys, wherein each of the keys being associated with a first scanning line and a second scanning line, b3. applying a second level to each of the scanning lines in sequence, wherein the application of the second level to the first scanning line associated with the actuated key generates a first level output from the second scanning line associated with the same actuated key, and wherein the application of the second level to the first scanning line associated with each un-actuated key generates a second level output from the second scanning line associated with the same un-actuated key, and b4. storing the outputs of the scanning lines which the second level are applied thereto in a memory means; and c. reading the memory means to determine the one of the keys that is actuated;

d. wherein the keyboard system comprises a plurality of diodes connected between the scanning lines and the method further comprises the steps of applying the second level to each of the scanning lines in sequence to receive an output of the second level from each of the scanning lines that has one of the diode associated therewith for detecting the presence of the diode.

2. A keyboard scanning circuit comprising:

a clock generation circuit for generating timing clock signals;

keyboard I/O port means comprising a plurality of data ports to which the timing clock signal is applied, each of the ports being associated with a scanning line, an actuatable key being arranged at an interconnection of two of the scanning lines so that when the key is not actuated, the associated scanning line having a first level output, and when the key is actuated, the associated scanning line having a second level output, the second level being different from the first level; and a key detection register for storing the outputs of the scanning lines;

the keyboard scanning circuit further comprises a plurality of diodes connected between the scanning lines and means of applying the second level to each of the scanning lines in sequence to receive an output of the second level from each of the scanning lines that has one of the diode associated therewith for detecting the presence of the diode.

3. The keyboard scanning circuit apparatus as claimed in claim 2, wherein the key detection register comprises first stage registers and second stage registers.

4. The keyboard scanning circuit apparatus as claimed in claim 2, wherein the clock generation circuit comprises a 32768 Hz oscillator.

5. The keyboard scanning circuit apparatus as claimed in claim 2, a plurality of diodes being further connected between the ports of the keyboard I/O port means.

* * * * *